US011398527B2

(12) United States Patent
Wang et al.

(10) Patent No.: US 11,398,527 B2
(45) Date of Patent: Jul. 26, 2022

(54) DISPLAY SUBSTRATE, WITH MICROCAVITY ADJUSTMENT PORTION, DISPLAY PANEL, AND DISPLAY APPARATUS

(71) Applicant: BOE TECHNOLOGY GROUP CO., LTD., Beijing (CN)

(72) Inventors: Can Wang, Beijing (CN); Can Zhang, Beijing (CN); Ming Yang, Beijing (CN); Han Yue, Beijing (CN); Ning Cong, Beijing (CN); Minghua Xuan, Beijing (CN); Xiaochuan Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 31 days.

(21) Appl. No.: 16/964,862

(22) PCT Filed: Dec. 25, 2019

(86) PCT No.: PCT/CN2019/128456
§ 371 (c)(1),
(2) Date: Jul. 24, 2020

(87) PCT Pub. No.: WO2020/143455
PCT Pub. Date: Jul. 16, 2020

(65) Prior Publication Data
US 2021/0066403 A1   Mar. 4, 2021

(30) Foreign Application Priority Data

Jan. 8, 2019   (CN) .......................... 201910016841.4

(51) Int. Cl.
*H01L 27/32*   (2006.01)
*H01L 51/52*   (2006.01)

(52) U.S. Cl.
CPC ...... *H01L 27/3211* (2013.01); *H01L 51/5265* (2013.01); *H01L 27/322* (2013.01)

(58) Field of Classification Search
CPC . H01L 27/3211; H01L 51/5265; H01L 27/322
(Continued)

(56) References Cited

U.S. PATENT DOCUMENTS

2014/0054556 A1    2/2014  Park et al.
2014/0084256 A1*   3/2014  Kim .................... H01L 51/56
                                                 257/40
(Continued)

FOREIGN PATENT DOCUMENTS

CN    103633111 A    3/2014
CN    103681734 A    3/2014
(Continued)

OTHER PUBLICATIONS

Notification to Grant Patent Right for Invention for CN App. No. 201910016841.4 dated Sep. 28, 2020. English translation provided; 9 pages.

(Continued)

*Primary Examiner* — Xia L Cross
(74) *Attorney, Agent, or Firm* — Procopio, Cory, Hargreaves & Savitch LLP

(57) ABSTRACT

A display substrate includes a driving substrate and a stacked structure disposed at a side of the driving substrate. The stacked structure includes a plurality of emission layers and a plurality of carrier transport layers that are stacked in a direction perpendicular to the side of the driving substrate. The stacked structure forms a plurality of light-emitting devices, and each light-emitting device includes at least two emission portions that are respectively located in at least two emission layers. The plurality of light-emitting devices include a plurality of first light-emitting devices and a
(Continued)

plurality of second light-emitting devices. Emission portions in each first light-emitting device are separated from each other. At least two emission portions in each second light-emitting device are adjacent to each other, and the at least two adjacent emission portions share at least one carrier transport layer.

16 Claims, 10 Drawing Sheets

(58) Field of Classification Search
    USPC .......................................................... 257/89
    See application file for complete search history.

(56) References Cited

U.S. PATENT DOCUMENTS

| 2014/0117315 | A1 | 5/2014 | Kim et al. |
| 2014/0131674 | A1 | 5/2014 | Park et al. |
| 2014/0183471 | A1 | 7/2014 | Heo |
| 2014/0353635 | A1 | 12/2014 | Chou et al. |
| 2015/0034923 | A1 | 2/2015 | Kim et al. |
| 2015/0144926 | A1 | 5/2015 | Lee et al. |
| 2016/0043338 | A1* | 2/2016 | Seo ................. H01L 27/323 257/89 |
| 2016/0079333 | A1* | 3/2016 | Shishido ........... G02F 1/134309 257/72 |
| 2016/0126297 | A1 | 5/2016 | Kim |
| 2017/0213876 | A1* | 7/2017 | Ohsawa .............. H01L 51/5203 |
| 2018/0151819 | A1 | 5/2018 | Kim |
| 2018/0158884 | A1 | 6/2018 | Lee |

FOREIGN PATENT DOCUMENTS

| CN | 103811525 A | 5/2014 |
| CN | 104218169 A | 12/2014 |
| CN | 104347807 A | 2/2015 |
| CN | 104681734 A | 6/2015 |
| CN | 108134010 A | 6/2018 |
| CN | 108155206 A | 6/2018 |
| CN | 109742252 A | 5/2019 |

OTHER PUBLICATIONS

First Office Action for related CN App. No. 201910016841.4 dated Mar. 3, 2020. English translation provided 13 pages.

* cited by examiner

DISPLAY SUBSTRATE, WITH MICROCAVITY ADJUSTMENT PORTION, DISPLAY PANEL, AND DISPLAY APPARATUS

CROSS-REFERENCE TO RELATED APPLICATIONS

This application is a national phase entry under 35 USC 371 of International Patent Application No. PCT/CN2019/128456 filed on Dec. 25, 2019, which claims priority to Chinese Patent Application No. 201910016841.4, filed with the Chinese Patent Office on Jan. 8, 2019, which are incorporated herein by reference in their entirety.

TECHNICAL FIELD

The present disclosure relates to the field of display technologies, and in particular, to a display substrate, a display panel and a display apparatus.

BACKGROUND

Organic light emitting diodes (OLED) have attracted much attention of the market due to its fast response speed, self-luminescence and other advantages. Also, in recent years, the application of OLED display panels is very diverse. For example, the OLED display panel is applied in fields such as flexible display, transparent display, and micro display.

SUMMARY

In one aspect, a display substrate is provided. The display substrate includes a driving substrate and a stacked structure disposed at a side of the driving substrate. The stacked structure includes a plurality of emission layers and a plurality of carrier transport layers that are stacked in a direction perpendicular to the side of the driving substrate. The stacked structure forms a plurality of light-emitting devices, and each of the plurality of light-emitting devices includes at least two emission portions that are respectively located in at least two of the plurality of emission layers. The plurality of light-emitting devices include a plurality of first light-emitting devices and a plurality of second light-emitting devices. Emission portions in each of the plurality of first light-emitting devices are separated from each other. At least two emission portions in each of the plurality of second light-emitting devices are adjacent to each other, and the at least two adjacent emission portions share at least one of the plurality of carrier transport layers.

In some embodiments, at least one emission portion in the first light-emitting device is in a same emission layer as any one of the at least two adjacent emission portions in the second light-emitting device. The number of the emission portions included in the first light-emitting device is less than the number of the emission portions included in the second light-emitting device.

In some embodiments, the first light-emitting device includes at least two emission portions, and the second light-emitting device includes at least three emission portions.

In some embodiments, each of the plurality of emission layers is capable of emitting light of one color, and different emission layers emit light of different colors.

In some embodiments, the display substrate has a plurality of pixel regions, and each of the plurality of pixel regions includes at least one first sub-pixel region and at least two second sub-pixel regions. In each pixel region, at least one first light-emitting device is disposed in the at least one first sub-pixel region respectively, and at least two second light-emitting devices are disposed in the at least two second sub-pixel regions respectively. The at least two second light-emitting devices respectively disposed in the at least two second sub-pixel regions are arranged adjacent to each other.

In some embodiments, in each pixel region and in the at least two second light-emitting devices respectively disposed in the at least two second sub-pixel regions of the pixel region, emission portions that emit light having a same color have an integrated structure.

In some embodiments, the plurality of emission layers include a first emission layer, a second emission layer and a third emission layer, and colors of light emitted from the three are different. The first light-emitting device includes a second emission portion in the second emission layer and a third emission portion in the third emission layer. The second light-emitting device includes a first emission portion in the first emission layer, a second emission portion in the second emission layer, and a third emission portion in the third emission layer. The first emission portion and the second emission portion in the second light-emitting device are adjacent to each other, and the first emission portion and the second emission portion in the second light-emitting device share the at least one of the plurality of carrier transport layers.

In some embodiments, a color of light emitted from the first emission layer is green, and a color of light emitted from the second emission layer is red. Or, a color of light emitted from the first emission layer is red, and a color of light emitted from the second emission layer is green. A color of light emitted from the third emission layer is blue.

In some embodiments, the light-emitting device further includes: a first electrode disposed at a side of the at least two emission portions in the light-emitting device proximate to the driving substrate, and a second electrode disposed at a side of the at least two emission portions away from the driving substrate in the light-emitting device. The first electrode includes a reflective electrode, and the second electrode is a translucent electrode.

In some embodiments, the first electrode further includes: a transparent electrode disposed at a side of the reflective electrode proximate to the at least two emission portions in the light-emitting device, and a microcavity adjustment portion disposed between the transparent electrode and the reflective electrode. The transparent electrode is electrically connected to the reflective electrode. Thicknesses of microcavity adjustment portions in light-emitting devices are not completely the same.

In some embodiments, the first electrode further includes: a transparent electrode disposed on a side of the reflective electrode proximate to the at least two emission portions in the light-emitting device. The transparent electrode is electrically connected to the reflective electrode. Thicknesses of transparent electrodes in light-emitting devices are not completely the same.

In some embodiments, a pixel density of the display substrate is greater than or equal to 1600 PPI.

In some embodiments, the driving substrate includes a base substrate, and the base substrate is a silicon chip.

In another aspect, a display panel is provided. The display panel includes: the display substrate according to any one of the embodiments described above, and a color filter layer disposed at a side of the stacked structure of the display substrate away from the driving substrate. The color filter layer includes a plurality of color filter portions, and the plurality of color filter portions corresponds to the plurality of light-emitting devices respectively. Each of the plurality of color filter portions is configured to filter light emitted from a light-emitting device corresponding to the color filter portion to allow predetermined light of a single color to pass through. Colors of light allowed to pass through different color filter portions are not completely the same.

In some embodiments, a color of light allowed to pass through the color filter portion is at least the same as a color of light emitted from one emission portion in the light-emitting device corresponding to the color filter portion.

In some embodiments, the plurality of color filter portions include N types of color filter portions, and the N types of color filter portions allow light of N colors to pass through respectively. The plurality of emission layers include N emission layers, and the N emission layers are capable of emitting light of N colors. N colors of light that is emitted from the N emission layers are the same as N colors of light that is allowed to pass through the N types of color filter portions. N is a positive integer greater than or equal to 3.

In some embodiments, N is equal to 3. The plurality of color filter portions include a plurality of first color filter portions, a plurality of second color filter portions and a plurality of third color filter portions. The plurality of emission layers include a first emission layer, a second emission layer, and a third emission layer. The first light-emitting device includes a second emission portion in the second emission layer and a third emission portion in the third emission layer. The second light-emitting device includes a first emission portion in the first emission layer, a second emission portion in the second emission layer, and a third emission portion in the third emission layer. The first emission portion and the second emission portion in the second light-emitting device are adjacent to each other, and the first emission portion and the second emission portion in the second light-emitting device share the at least one of the plurality of carrier transport layers.

The display substrate has a plurality of pixel regions, and each of the plurality of pixel regions includes one first sub-pixel region and two second sub-pixel regions. The first light-emitting device is located in the first sub-pixel region, and the second light-emitting device is located in the second sub-pixel region.

In each pixel region, one first color filter portion is located in the first sub-pixel region, one second color filter portion is located in one of the two second sub-pixel regions, and one third color filter portion is located in the other of the two second sub-pixel regions.

In some embodiments, a color of light emitted from the first emission layer is green, a color of light emitted from the second emission layer is red, and a color of light emitted from the third emission layer is blue. The first color filter portion allows red light to pass through, the second color filter portion allows green light to pass through, and the third color filter portion allows blue light to pass through; or, the first color filter portion allows red light to pass through, the second color filter portion allows blue light to pass through, and the third color filter portion allows green light to pass through.

Or, a color of light emitted from the first emission layer is red, a color of light emitted from the second emission layer is green, and a color of light emitted from the third emission layer is blue. The first color filter portion allows green light to pass through, the second color filter portion allows red light to pass through, and the third color filter portion allows blue light to pass through; or, the first color filter portion allows green light to pass through, the second color filter portion allows blue light to pass through, and the third color filter portion allows red light to pass through.

In some embodiments, in the emission portions of the light-emitting device, a phase change of light, which travels in a round trip light path between an emission portion of the light-emitting device that emits light having a same color as a color of the color filter portion corresponding to the light-emitting device and a reflective electrode in a first electrode of the light-emitting device, is an integer multiple of $2\pi$.

In another aspect, a display apparatus is provided. The display apparatus includes the display substrate according to the above embodiments.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, an actual timing of a signal, etc. involved in the embodiments of the present disclosure.

DETAILED DESCRIPTION

The technical solutions in some embodiments of the present disclosure will be described clearly and completely with reference to the accompanying drawings. Obviously, the described embodiments are merely some but not all of embodiments of the present disclosure. All other embodiments made on the basis of the embodiments of the present disclosure by a person of ordinary skill in the art shall be included in the protection scope of the present disclosure.

Unless the context requires otherwise, throughout the specification and claims, terms "comprise" and other forms thereof, such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments or examples in any suitable manner.

Terms "first" and "second" are only used for describing purposes, and cannot to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

In the description of some embodiments, terms such as "coupled" and "connected" and their extensions may be used. For example, term "connected" may be used in the description of some embodiments to indicate that two or more components are in physical or electrical contact directly. For another example, term "coupled" may be used in the description of some embodiments to indicate that two or more components are in physical or electrical contact directly. However, terms such as "coupled" or "communicatively coupled" may also mean that two or more components are not in direct contact with each other but still cooperate or interact with each other. The embodiments disclosed herein are not necessarily limited to the contents herein.

"At least one of A, B and C" has a same meaning as "at least one of A, B or C", and both include the following combinations of A, B and C: only A, only B, only C, a combination of A and B, a combination of A and C, a combination of B and C, and a combination of A, B and C.

Figure 1:
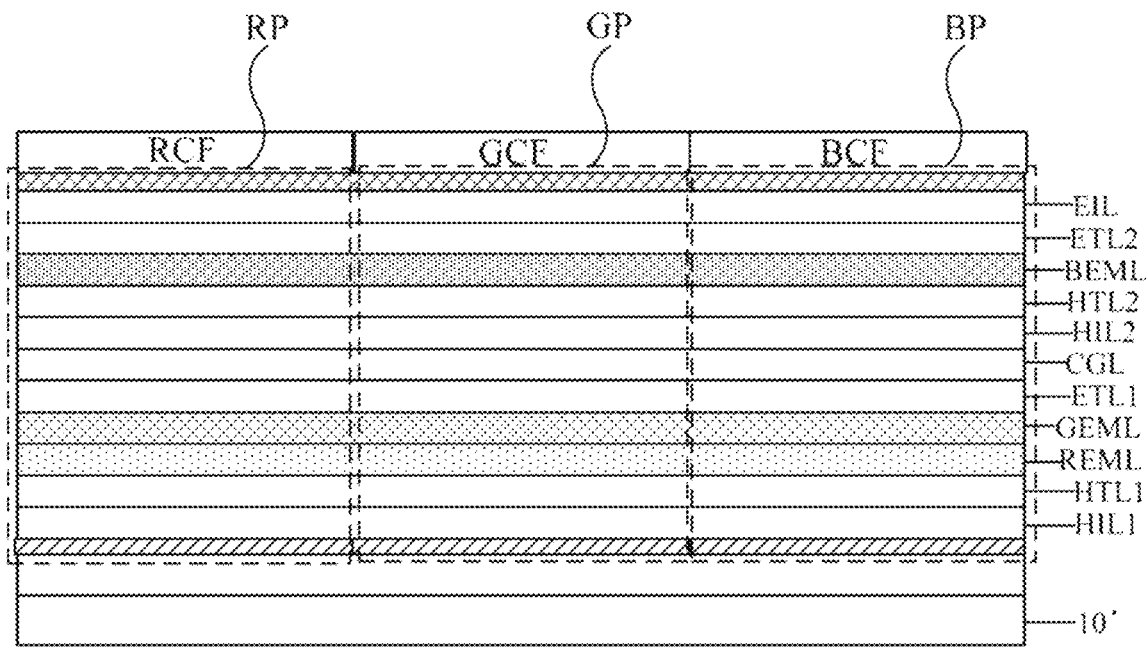
FIG. 1 is a structural diagram of a display panel in the related art.

In the related art, an OLED display panel has a plurality of sub-pixel regions. The OLED display panel includes a plurality of sub-pixels. Each of the plurality of sub-pixels is located in a sub-pixel region. Each sub-pixel includes at least one light-emitting device. As shown in FIG. 1, the OLED display panel includes a driving substrate 10' and a plurality of light-emitting devices disposed at a side of the driving substrate 10' (for example, RP, GP, and BP). Each of the plurality of light-emitting devices is configured to emit white light. The display panel uses a combination of white light and a color filter layer (for example, the color filter layer includes a red color filter portion RCF, a green color filter portion GCF, and a blue color filter portion BCF) to emit light.

For example, as shown in FIG. 1, the display panel includes a red emission layer REML, a green emission layer GEML, and a blue emission layer BEML. In each of the plurality of light-emitting devices (for example, any one of a red light-emitting device RP, a green light-emitting device GP, or a blue light-emitting device BP), light emitted from each light-emitting device is formed by superimposing light emitted from the emission layers of the above three colors, which is mixed white light. The mixed white light exits through a color filter portion (for example, one of the red color filter portion RCF, the green color filter portion GCF or the blue color filter portion BCF) corresponding to each light-emitting device (for example, any one of the red light-emitting device RP, the green light-emitting device GP or the blue light-emitting device BP). Therefore, the sub-pixels to which the light-emitting devices belong display different colors (red R, green G, or blue B).

It will be understood that, the display panel has a plurality of sub-pixel regions, and each light-emitting device is located in a sub-pixel region. A color displayed by the sub-pixel to which the light-emitting device belongs is the same as a color of the color filter portion disposed in the sub-pixel region where the light-emitting device is located.

In practical applications, at least two emission layers having the same type of light-emitting materials are arranged adjacent to each other, and the at least two emission layers arranged adjacent to each other share carrier transport layer(s). For example, the red emission layer REML and the green emission layer GEML generally adopt phosphorescent materials. Therefore, the red emission layer REML and the green emission layer GEML are arranged adjacent to each other, and share the carrier transport layer(s). The carrier transport layer(s) include at least one of a hole injection layer (HIL), a hole transport layer (HTL), an electron transport layer (ETL), an electron injection layer (EIL), and the like.

For example, as shown in FIG. 1, the red emission layer REML and the green emission layer GEML are arranged adjacent to each other, and share a plurality of carrier transport layers (for example, the plurality of carrier transport layers include a hole injection layer HIL1, a hole transport layer HTL1 and an electron transport layer ETL1).

However, in a case where the entire red emission layer REML and the entire green emission layer GEML share the carrier transport layer(s), due to the limitation of the number of electrons and holes, luminous efficiency of the red emission layer REML and the green emission layer GEML may decrease, thereby affecting luminous efficiency of all light-emitting devices in the display panel.

Figure 2:
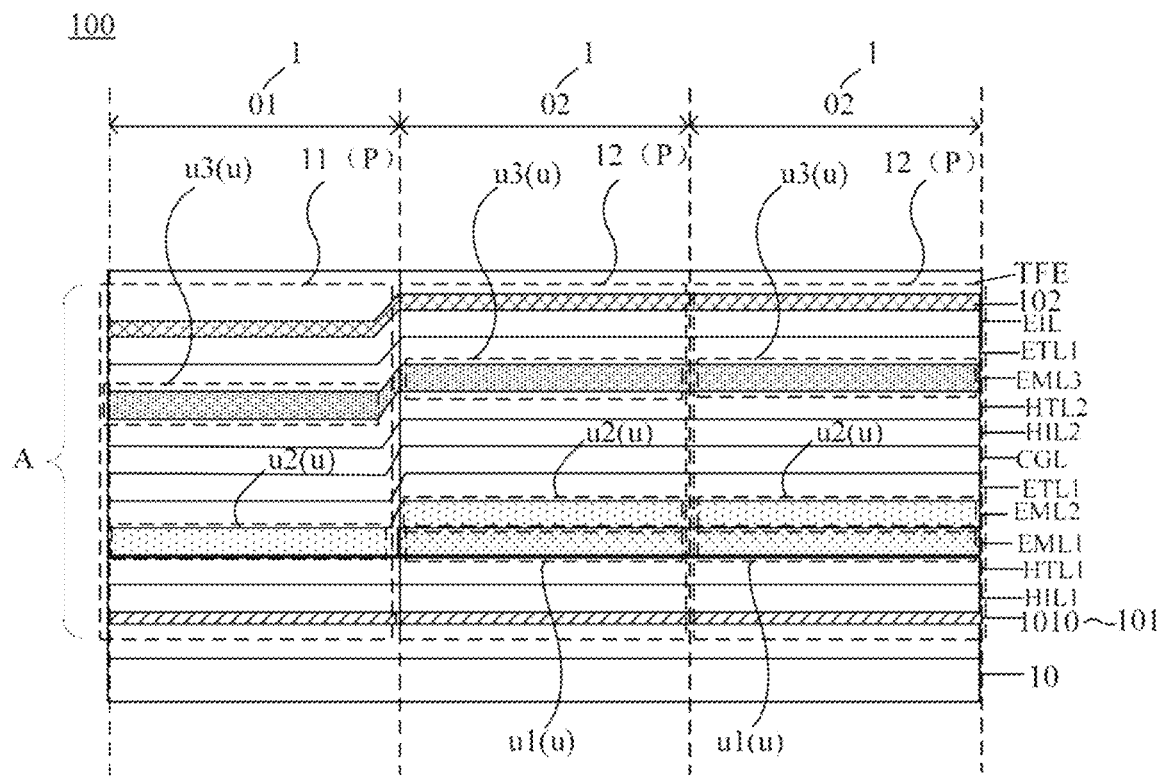
FIG. 2 is a structural diagram of a display substrate, according to some embodiments of the present disclosure.

On this basis, some embodiments of the present disclosure provide a display substrate. As shown in FIG. 2, the display substrate includes a driving substrate 10 and a stacked structure A disposed at a side of the driving substrate 10. The stacked structure A includes a plurality of emission layers (EML) and a plurality of carrier transport layers that are stacked in a direction perpendicular to the driving substrate 10. The stacked structure A forms a plurality of light-emitting devices P. Each light-emitting device P of the plurality of light-emitting devices P includes at least two emission portions u that are respectively in at least two of the plurality of emission layers.

In some embodiments, each of the plurality of emission layers is able to emit light of one color, and different emission layers emit light of different colors.

For example, as shown in FIG. 2, an example where the plurality of emission layers include three emission layers is used for illustration. Specifically, the plurality of emission layers include a first emission layer EML1, a second emission layer EML2 and a third emission layer EML3. Each of the first emission layer EML1, the second emission layer EML2 and the third emission layer EML3 is able to emit light of one color, and colors of light emitted from the three emission layers are different.

It should be noted that the carrier transport layer include the hole injection layer (HIL), the hole transport layer (HTL), the electron transport layer (ETL), and the electron injection layer (EIL), which is not limited in some embodiments of the present disclosure, and may be selected according to the needs in practice.

In some embodiments, the display substrate 100 has a plurality of pixel regions 1. Each of the plurality of pixel regions 1 includes at least one first sub-pixel region 01 and at least two second sub-pixel regions 02. It should be noted that FIG. 2 shows an example in which one pixel region 1 includes one first sub-pixel region 01 and two second sub-pixel regions 02. Some embodiments of the present disclosure do not limit the number of first sub-pixel regions 01 and the number of second sub-pixel regions 02 included in one pixel region. An example in which one pixel region 1 includes one first sub-pixel region 01 and two second sub-pixel regions 02 is used for illustration below.

In some embodiments, the plurality of light-emitting devices P include a plurality of first light-emitting devices 11 and a plurality of second light-emitting devices 12. In each pixel region 1, at least one first light-emitting device 11 is disposed in the at least one first sub-pixel region 01 respectively; at least two second light-emitting devices 12 are disposed in the at least two second sub-pixel regions 02 respectively. That is, each first light-emitting device 11 is located in a first sub-pixel region 01, and each second light-emitting device 12 is located in a second sub-pixel region 02. In addition, in each pixel region 1, the at least two second light-emitting devices respectively disposed in the at least two second sub-pixel regions are arranged adjacent to each other.

In some embodiments, as shown in FIG. 2, the first emission layer EML1 includes a plurality of first emission portions u1, and each of the plurality of first emission portions u1 is located in a sub-pixel region. The second emission layer EML2 includes a plurality of second emission portions u2, and each of the plurality of second emission portions u2 is located in a sub-pixel region. The third emission layer EML3 includes a plurality of third emission portions u3, and each of the plurality of third emission portions u3 is located in a sub-pixel region.

In some embodiments, the first light-emitting device 11 includes at least two emission portions u. The second light-emitting device 12 includes at least three emission portions u.

For example, as shown in FIG. 2, the first light-emitting device 11 includes a second emission portion u2 in the second emission layer EML2 and a third emission portion u3 in the third emission layer EML3. The second light-emitting device 12 includes a first emission portion u1 in the first emission layer EML1, a second emission portion u2 in the second emission layer EML2 and a third emission portion u3 in the third emission layer EML3.

In some embodiments, emission portions u in each of the plurality of first light-emitting devices 11 are separated from each other. At least two emission portions u in each of the plurality of second light-emitting devices 12 are adjacent to each other. The at least two adjacent emission portions u share at least one of the plurality of carrier transport layers.

For example, as shown in FIG. 2, the first light-emitting device 11 includes a second emission portion u2 and a third emission portion u3, and the second emission portion u2 and the third emission portion u3 are not adjacent to each other. The second light-emitting device 12 includes a first emission portion u1, a second emission portion u2, and a third emission portion u3; the first emission portion u1 and the second emission portion u2 are arranged adjacent to each other, and share at least one carrier transport layer. The at least one carrier transport layer includes three carrier transport layers (e.g., the hole injection layer HIL1, the hole transport layer HTL1, and the electron transport layer ETL1). The first emission portion u1 and the second emission portion u2 are arranged adjacent to each other, which may reduce a driving voltage applied to the sub-pixel region in which they are located.

In some embodiments, in the emission portions u in the first light-emitting device 11, at least one emission portions u is in a same emission layer as any one of the at least two adjacent emission portions u in the second light-emitting device 12. The number of the emission portions u included in the first light-emitting device 11 is less than the number of the emission portions u included in the second light-emitting device 12.

For example, as shown in FIG. 2, the number of the emission portions u included in the first light-emitting device 11 is two, and the number of the emission portions u included in the second light-emitting device 12 is three. The number of the emission portions u included in the first light-emitting device 11 is less than the number of the emission portions u included in the second light-emitting device 12. Moreover, the second emission portion u2 in the first light-emitting device 11 and the second emission portion u2 in the second light-emitting device 12 are in the same second emission layer EML2.

In summary, in the above embodiments, each emission layer in some light-emitting devices P (i.e., the first light-emitting device 11) is provided with carrier transport layer(s) separately. In this way, an electrical influence (for example, a limitation of the number of holes and electrons) between the emission layers in the first light-emitting device 11 may be avoided, and the light emission efficiency of the light-emitting device P is improved.

In some embodiments, as shown in FIG. 2, in each pixel region and in the at least two second light-emitting devices 12 respectively disposed in the at least two second sub-pixel regions 02 of the pixel region, emission portions u that emit light having a same color have an integrated structure.

For example, as shown in FIG. 2, in the pixel region 1, two second light-emitting devices 12 in the two second sub-pixel regions 02 are arranged adjacent to each other. Light emitted from two first emission portions u1 in the two second light-emitting devices 12 have the same color and the two first emission portions u1 have the integrated structure.

In some embodiments, since not all light-emitting devices in the sub-pixel regions have a first emission portion u1 in the first emission layer EML1 (for example, the first light-emitting device does not have a first emission portion u1), the first emission layer EML1 is manufactured by using a fine metal mask (FMM). In each pixel region, the two first emission portions u1 in the two second light-emitting devices 12 are in the first emission layer EML1. In this way, when the first emission layer EML1 is manufactured by using the FMM, one opening of the FMM may correspond to the two second sub-pixel regions 02. That is, the opening of the FMM is larger, and thereby difficulty of manufacturing the first emission layer EML1 using the FMM may be reduced.

In addition, in a case where the display substrate has a high pixel density (for example, the pixel density is greater than or equal to 1600 PPI), as the pixel density of the display substrate increases, a space between the sub-pixel regions of the display substrate becomes smaller. In this case, the difficulty of manufacturing the first emission layer EML1 using the FMM may increase, and even the manufacturing of the first emission layer EML1 cannot be completed. However, in some embodiments of the present disclosure, in the case where the first emission layer EML1 is manufactured by using the FMM, one opening of the FMM may correspond to two second sub-pixel regions 02. Therefore, the difficulty of manufacturing the first emission layer EML1 using the FMM is significantly reduced, and even if the display substrate in some embodiments of the present disclosure has a high pixel density, it can be manufactured by using the FMM.

Therefore, in some embodiments of the present disclosure, the display substrate 100 may have a high pixel density. For example, the pixel density is greater than or equal to 1600 PPI. For example, the pixel density of the display substrate is 1800 PPI, 2000 PPI, 2500 PPI or 4000 PPI.

In some embodiments, as shown in FIG. 2, in a case where the second emission layer EML2 and the third emission layer EML3 of the display substrate 100 are manufactured, an open mask (i.e., a mask having a large opening corresponding to all sub-pixel regions) may be used to simplify the manufacturing process.

In some embodiments, a color of light emitted from the third emission layer EML3 is blue. In addition, a color of light emitted from the first emission layer EML1 is green, and a color of light emitted from the second emission layer EML2 is red; or, a color of light emitted from the first emission layer EML1 is red, and a color of light emitted from the second emission layer EML2 is green.

For example, the color of light emitted from the third emission layer EML3 is blue, and the third emission layer EML3 is made of a fluorescent material. Both the first emission layer EML1 and the second emission layer EML2 may be made of phosphorescent materials, so that the first emission layer EML1 and the second emission layer EML2 may share the carrier transport layer(s), and luminescence effects of the two are good. Of course, both the first emission layer EML1 and the second emission layer EML2 may also be made of fluorescent materials, which is not limited in some embodiments of the present disclosure. In addition, the first emission layer EML1 and the second emission layer EML2 may be provided with an additional electron injection layer EIL, which is not limited in the present disclosure.

In some embodiments, as shown in FIG. 2, a charge generation layer (CGL) is disposed between the third emission layer EML3 and the second emission layer EML2, so as to generate more charges.

In some embodiments, as shown in FIG. 2, the light-emitting device P further includes: a first electrode 101 disposed at a side of the at least two emission portions u of the light-emitting device P proximate to the driving substrate 10, and a second electrode 102 disposed at a side of the at least two emission portions u away from the driving substrate 10.

The first electrode 101 includes a reflective electrode 1010, so that the light emission rate of the display device P may be improved. The second electrode 102 is a translucent electrode.

For example, a material of the reflective electrode 1010 is metal. A material of the translucent electrode is at least one of metal and metal oxide. For example, the translucent electrode is a translucent film made of magnesium, silver or other metal with a small thickness. The thickness of the film is 80 angstroms (Å) to 120 angstroms (Å) (for example, 80 Å, 100 Å or 120 Å). For another example, the translucent electrode is an electrode made of metal oxide such as indium tin oxide (ITO), and a thickness of the electrode is greater than or equal to 2000 Å. Light emitted from the emission portions in the light-emitting device P is reflected by the reflective electrode 1010 to the translucent electrode, and then exits the light-emitting device P. In this way, it can be understood that the light-emitting device P itself has microcavity effect, and the light emitted from the emission portion interferes under action of the microcavity effect. Therefore, the light emission rate of the light-emitting device P may be improved.

Figure 3:
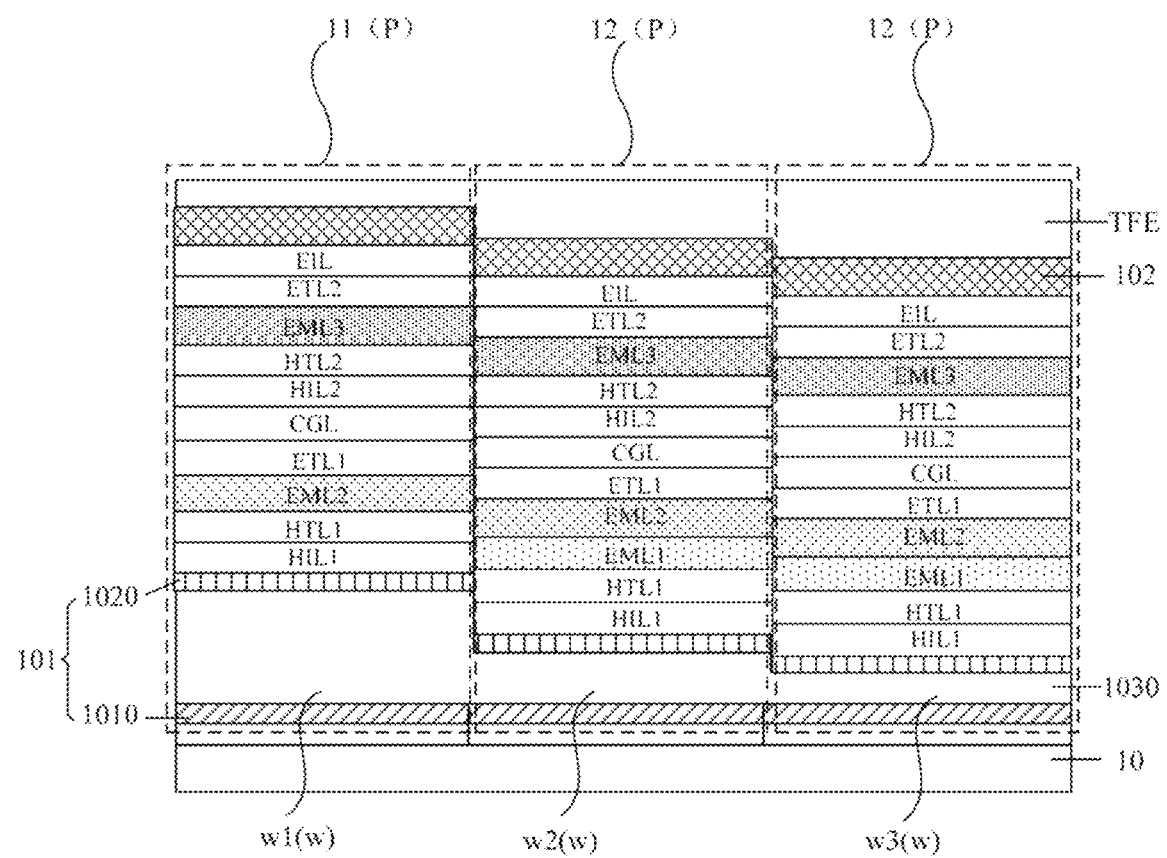
FIG. 3 is a structural diagram of another display substrate, according to some embodiments of the present disclosure.

In some embodiments, as shown in FIG. 3, the first electrode 101 further includes: a transparent electrode 1020 disposed at a side of the reflective electrode 1010 proximate to the at least two emission portions in the light-emitting device, and a microcavity adjustment portion w disposed between the transparent electrode 1020 and the reflective electrode 1010. The transparent electrode 1020 is electrically connected to the reflective electrode 1010. Thicknesses of microcavity adjustment portions w in the light-emitting devices P are not completely the same. A via hole is disposed in the microcavity adjustment portion w, and the via hole is configured to implement the electrical connection between the transparent electrode 1020 and the reflective electrode 1010.

In some embodiments, the thickness of the microcavity adjustment portion w in the light-emitting device P is related to a wavelength of the light emitted from the light-emitting device P. The light emitted from the light-emitting device P is light after the superposition of light emitted from the plurality of emission layers in the light-emitting device P.

Specifically, with respect to the microcavity adjustment portion, a phase difference δ and a thickness d of the microcavity adjustment portion satisfy an equation: $\delta=2j(\lambda/2)=2nd\cos\theta$, where j is an integer, λ is the wavelength of exit light, n is an average refractive index of a medium in the microcavity adjustment portion, d is the thickness of the microcavity adjustment portion, and θ is a reflection angle. Herein, the reflection angle θ is an included angle between light and a normal of the reflective electrode, where a color of the light that is emitted from an emission portion in the light-emitting device P and incident on the reflective electrode is the same as a color of the filter potion corresponding to the light-emitting device P.

On this basis, in the emission portions of the light-emitting device P, a phase change of light, which travels in a round trip light path between the emission portion of the light-emitting device that emits light having a same color as a color of the color filter portion corresponding to the light-emitting device and a reflective electrode in the first electrode of the light-emitting device, is an integer multiple of 2π. In this way, interference between light directly emitted from the emission portion and light reflected by the reflective electrode 1010 may be enhanced, that is, a strong microcavity is formed. The microcavity adjustment portion w may make a luminescence spectrum of the emission portion in the light-emitting device that emits light having a same color as the color of the filter potion corresponding to the light-emitting device narrow; and to a certain extent, the microcavity adjustment portion w may filter light that is emitted from the emission portion(s) and has a color different from the color of the filter potion corresponding to the light-emitting device. In this way, on a basis of ensuring that the display panel 200 reaches a white balance, brightness, color gamut (e.g., NTSC is greater than or equal to 100%) and color purity of the light emitted from the light-emitting device P are improved, and the light emitted from the light-emitting device is optimized.

In some embodiments, a plurality of microcavity adjustment portions w in the plurality of light-emitting devices P are integrally formed, and form a microcavity adjustment layer 1030. In a process of manufacturing the microcavity adjustment layer 1030, the entire microcavity adjustment layer 1030 may be evaporated according to the maximum thickness of the microcavity adjustment layer 1030, and then etched according to actual thicknesses required by different light-emitting devices P, so as to implement an effect that the thicknesses of the microcavity adjustment portions w in the light-emitting devices P are not completely the same. Or, starting from the minimum thickness of the microcavity adjustment layer 1030, multiple vapor depositions may be performed and the effect that the thicknesses of the microcavity adjustment portion w in the light emitting device P are not completely the same may be achieved by stacking layers on top of another.

Figure 4:
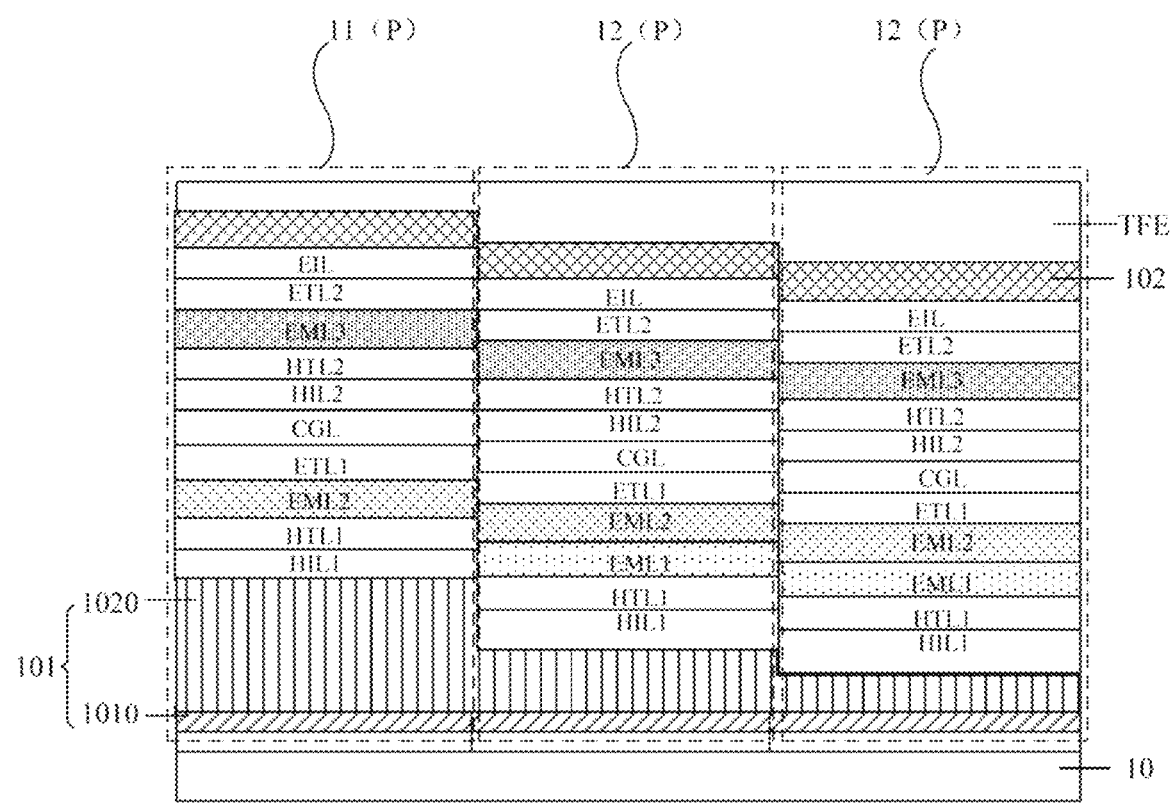
FIG. 4 is a structural diagram of yet another display substrate, according to some embodiments of the present disclosure.

In some embodiments, as shown in FIG. 4, the first electrode further includes: a transparent electrode 1020 disposed on a side of the reflective electrode 1010 proximate to the at least two emission portions in the light-emitting device. The transparent electrode 1020 is electrically connected to the reflective electrode 1010. Thicknesses of the transparent electrodes 1020 in the light-emitting devices P are not completely the same.

It should be noted here that, FIGS. 3 and 4 only schematically illustrate a structure of the microcavity adjustment portion, the microcavity adjustment layer and the first electrode, and do not specially show a relationship of structures of the film layers (e.g., the second electrode, and the carrier transport layers) in the light-emitting devices. The relationship of the structures of the film layers in the light-emitting devices may refer to FIG. 2.

In some embodiments, the first electrode 101 is an anode (i.e., a pixel electrode), and the second electrode 102 is a cathode (i.e., a common electrode); or, the first electrode 101 is a cathode and the second electrode 102 is an anode; which is not limited by some embodiments of the present disclosure.

For example, in a case where the first electrode 101 is an anode and the second electrode 102 is a cathode, a plurality of first electrodes 101 in the plurality of light-emitting devices P are electrically insulated from each other, and a plurality of second electrodes 102 in the plurality of light-emitting devices P may be connected to each other. For example, the second electrode 102 is a planar electrode.

In some embodiments, the driving substrate 10 includes a base substrate, and the base substrate is a silicon chip. A plurality of pixel driving circuits are formed on the silicon chip. A plurality of light-emitting devices P are manufactured on the silicon chip, and anodes in the plurality of light-emitting devices P are coupled to the pixel driving circuits. For example, the display substrate uses the silicon chip as a substrate, and the stacked structure A, etc. is manufactured thereon. In this way, the display substrate has advantages such as high mobility and stable performance. In addition, in the case of using the silicon chip, the display substrate may have a high resolution, and a pixel area thereof may be significantly reduced, and thereby it is beneficial to realize that the display substrate 100 having the driving substrate 10 is applied to the field of micro display.

Herein, the field of micro display is, for example, an augmented reality (AR) display field, a virtual reality (VR) display field, or a display field related to portable electronic devices (such as a smart watch). For example, augmented reality (AR) is particularly suitable for helmet-mounted displays, stereoscopic displays, glass-type displays, etc., which may be connected to mobile communication networks, satellite positioning and other systems, and therefore accurate image information may be obtained at any place, or at any time. The OLED display has important values in the fields, which requires the display substrate to have characteristics such as high brightness and high PPI.

In some embodiments, since the film layers in the display substrate may be easily damaged due to an intrusion of moisture and oxygen, as shown in FIG. 2, the display substrate 100 further includes an encapsulation structure disposed on a side of the second electrode 102 away from the driving substrate 10. For example, the encapsulation structure is an encapsulation film TFE, and the encapsulation film may include inorganic film(s) and organic film(s) that are stacked.

Figure 5:
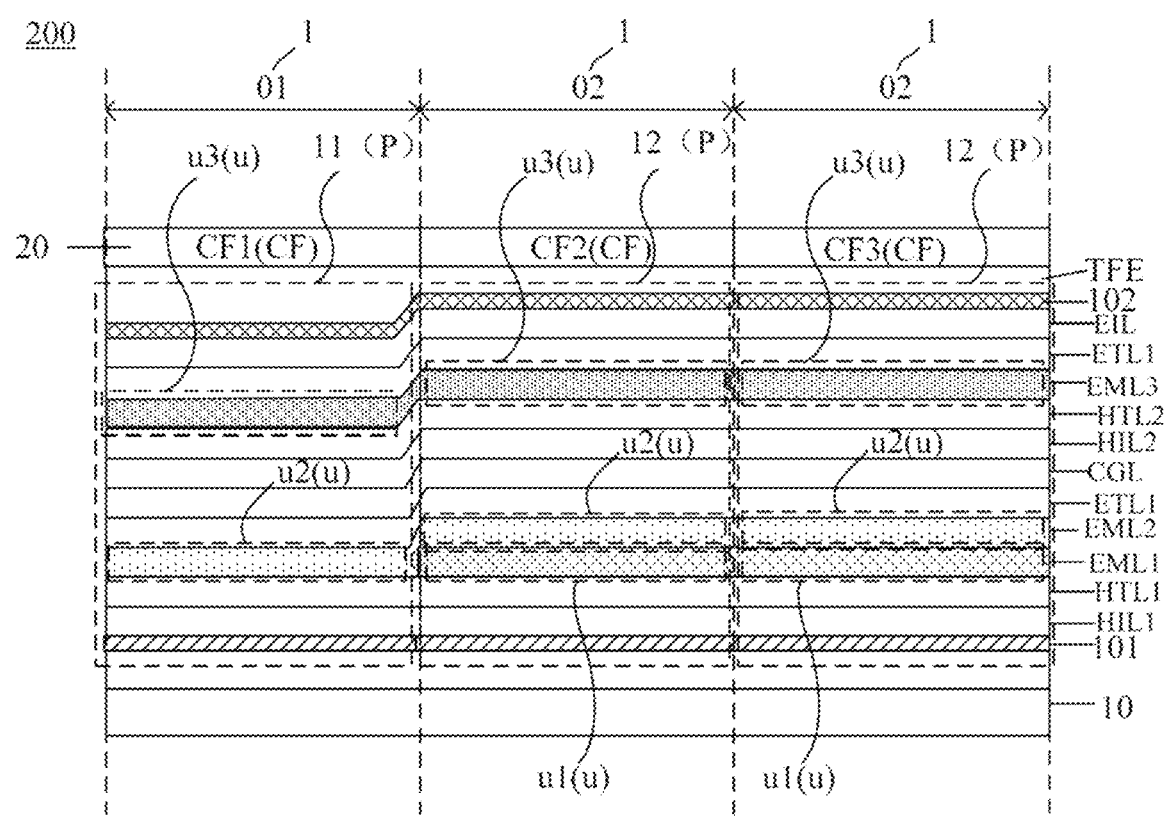
FIG. 5 is a structural diagram of a display panel, according to some embodiments of the present disclosure.

Some embodiments of the present disclosure provide a display panel. As shown in FIG. 5, the display panel 200 includes: the display substrate 100 in some embodiments described above, and a color filter layer 20 disposed at a side of the stacked structure of the display substrate 100 away from the driving substrate 10. The color filter layer 20 includes a plurality of color filter portions CF, and the plurality of color filter portions CF correspond to the plurality of light-emitting devices P respectively.

Each color filter portion CF of the plurality of color filter portions CF is configured to filter light emitted from a light-emitting device P corresponding to the color filter portion to allow predetermined light of a single color to pass through. Colors of light allowed to pass through different color filter portions CF are not completely the same.

For example, as shown in FIG. 5, in the pixel region 1, the color filter layer 20 includes three color filter portions CF, and the three color filter portions CF correspond to three light-emitting devices P respectively. That is, an orthographic projection of each light-emitting device P on the driving substrate 10 coincides with an orthographic projection of the color filter portion CF corresponding to the light-emitting device on the driving substrate 10; or, the orthographic projection of each light-emitting device P on the driving substrate 10 is within the orthographic projection of the corresponding color filter portion CF corresponding thereto on the driving substrate 10.

In some embodiments, the plurality of color filter portions CF include N types of color filter portions, and the N types of color filter portions CF allow light of N colors to pass through respectively. The plurality of emission layers include N emission layers, and the N emission layers can emit light of N colors. The N colors of light emitted from the N emission layers are the same as the N colors of light allowed to pass through the N types of color filter portions CF respectively. N is a positive integer greater than or equal to 3. For example, N is 3, 4, or 5.

In some embodiments, the color of the light allowed to pass through the color filter portion CF is at least the same as a color of light emitted from one emission portion u in the corresponding light-emitting device P. The color of each light-emitting device P is the same as the color of the color filter portion CF corresponding to the light-emitting device P. That N is equal to 3 is taken as an example for illustration below.

For example, the plurality of color filter portions CF include: a plurality of first color filter portions CF1, a plurality of second color filter portions CF2, and a plurality of third color filter portions CF3. In each pixel region 1, as shown in FIG. 5, the first color filter portion CF1 is located in the first sub-pixel region 01, the second color filter portions CF2 is located in one of two second sub-pixel regions 02, and the third color filter portions CF3 is located in the other of the two second sub-pixel regions 02.

Figure 6A:
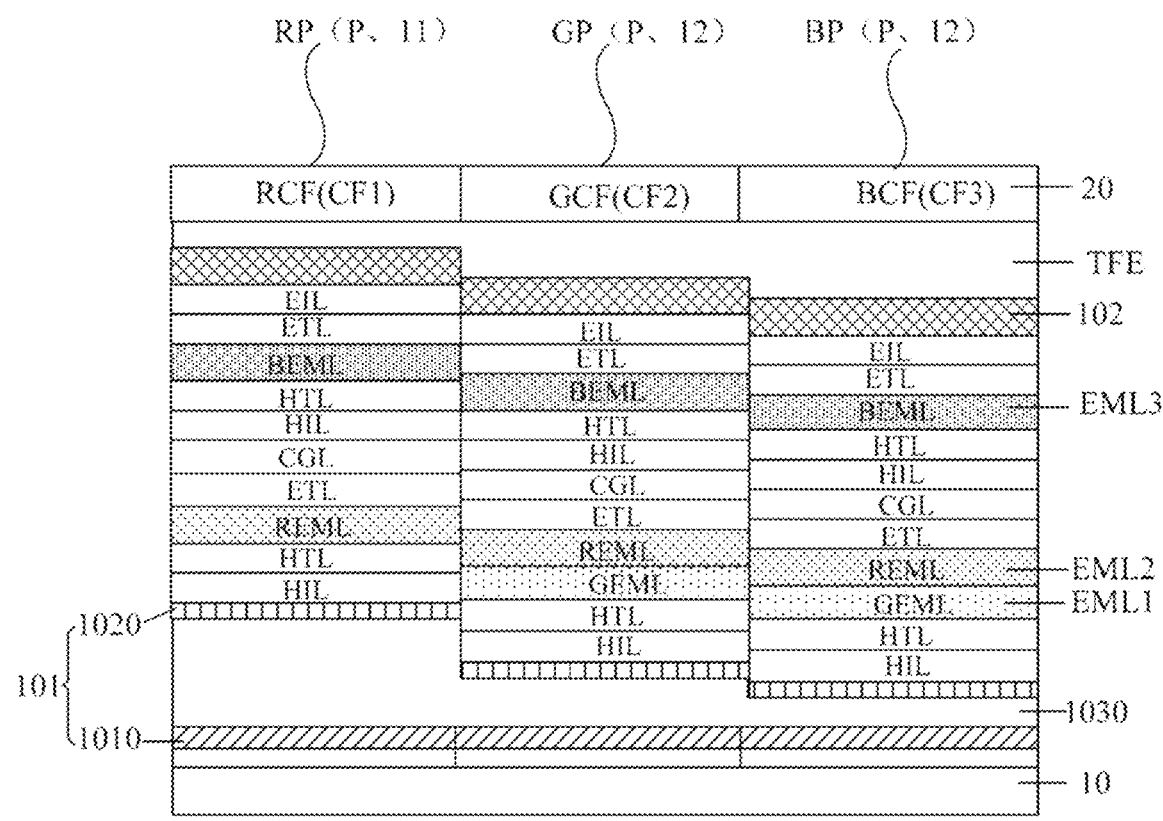
FIG. 6A is a structural diagram of another display panel, according to some embodiments of the present disclosure.
Figure 6B:
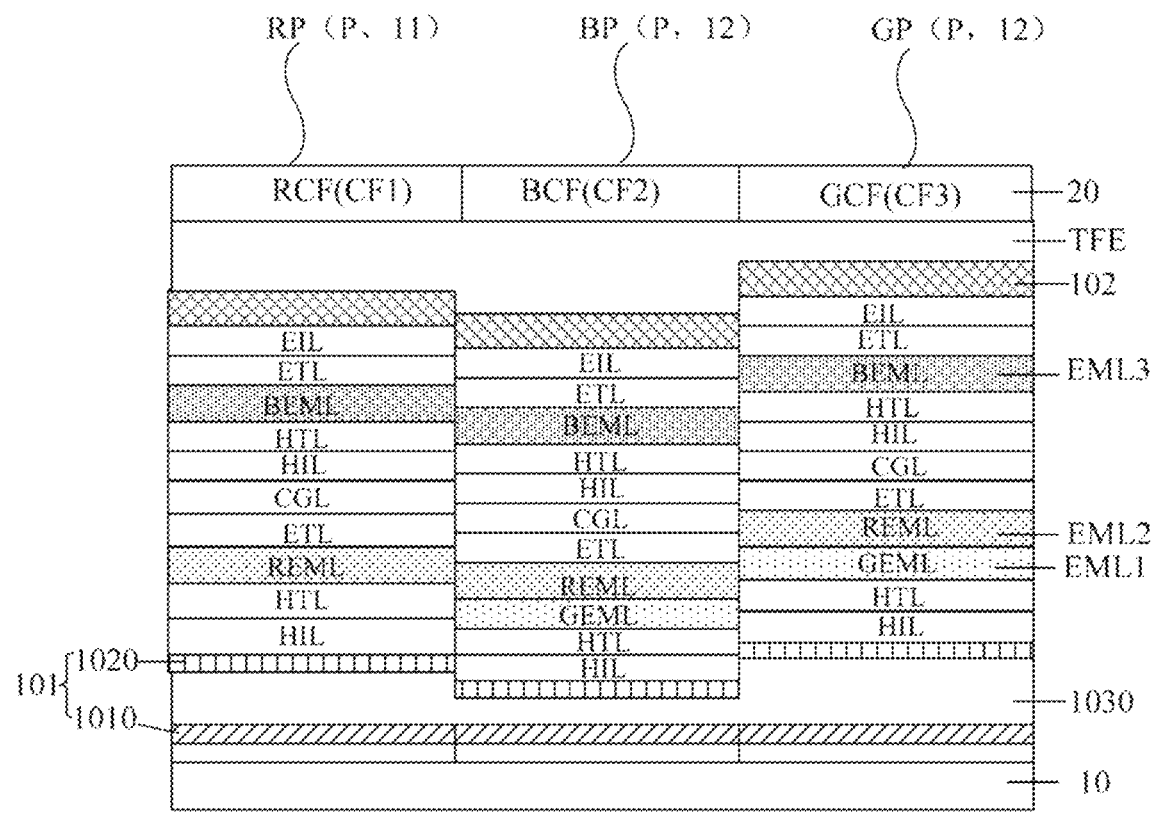
FIG. 6B is a structural diagram of yet another display panel, according to some embodiments of the present disclosure.

In some embodiments, a color of light emitted from the first emission layer EML1 is green, a color of light emitted from the second emission layer EML2 is red, and a color of light emitted from the third emission layer EML3 is blue. As shown in FIG. 6A, the first color filter portion CF1 allows red light to pass through, the second color filter portions CF2 allows green light to pass through, and the third color filter portions CF3 allows blue light to pass through. Or, as shown in FIG. 6B, the first color filter portion CF1 allows red light to pass through, the second color filter portions CF2 allows blue light to pass through, and the third color filter portions CF3 allows green light to pass through.

Figure 7A:
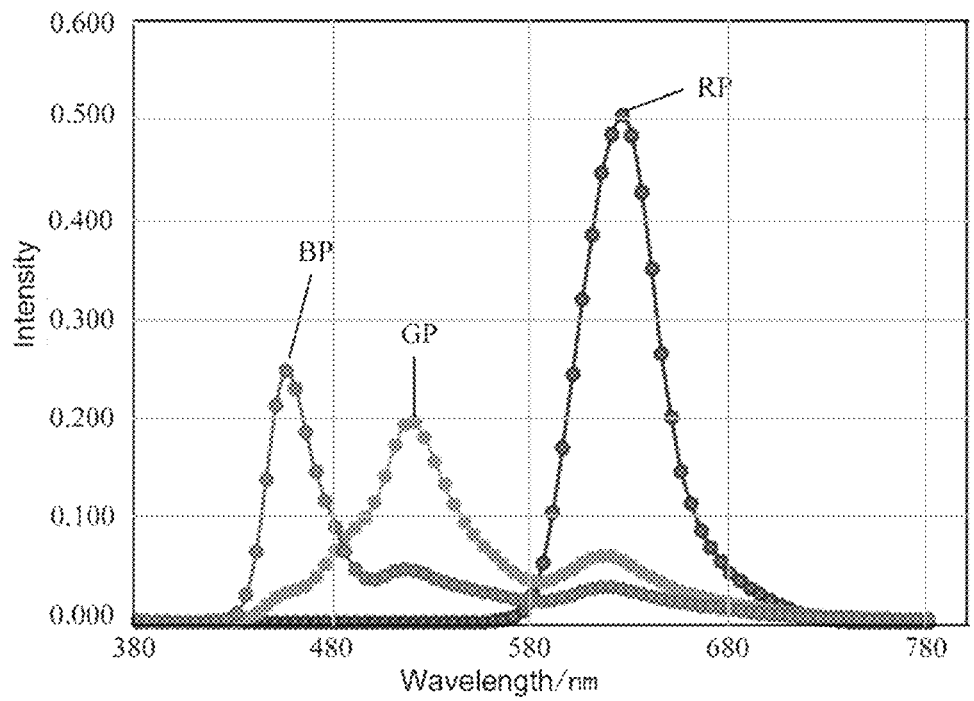
FIG. 7A is a comparison diagram of brightness of simulated light emitted from light-emitting devices of different colors in the display panel shown in FIG. 6A or 6B.

The first emission portion (a green emission portion) is not disposed in the first light-emitting device (a red light-emitting device RP), and different emission portions do not share the carrier transport layer(s), and thus the electrical influence (for example, the limitation of the number of holes and electrons) caused by different emission portions sharing the carrier transport layer(s) may be avoided. As shown in FIG. 7A, an intensity of light emitted from the red light-emitting device RP (i.e., light emission efficiency of red light) is significantly higher than intensities of light emitted from other light-emitting devices. Therefore, it can be seen that the above arrangement improves the light emission efficiency of the first light-emitting device (the red light-emitting device RP).

Figure 7B:
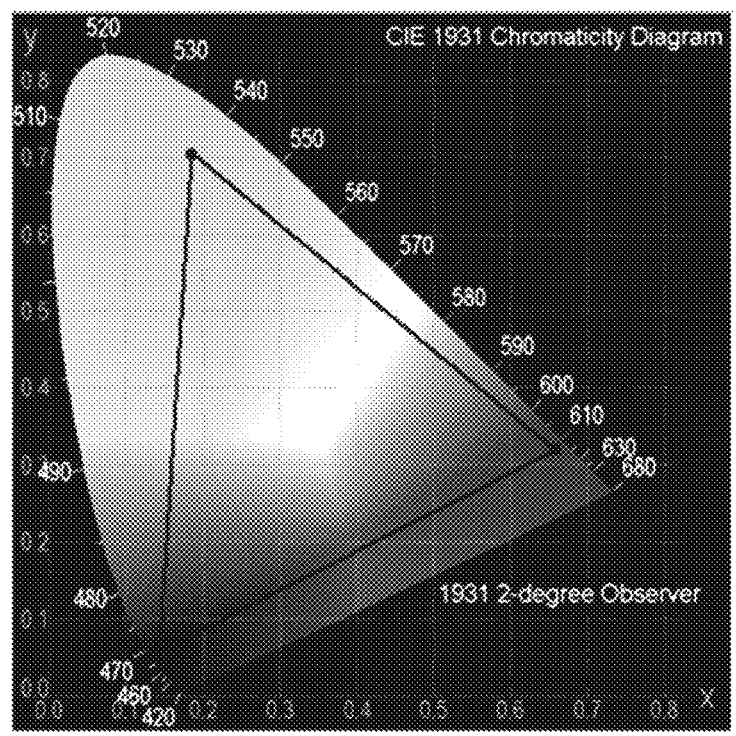
FIG. 7B is a diagram showing color gamut of the display panel shown in FIG. 6A or 6B.

In addition, after performing a color gamut simulation on the above display panel, according to simulation results, as shown in FIG. 7B, NTSC is 108%. Color coordinates Rx and Ry of the red light-emitting device RP are 0.067 and 0.324, respectively, and one of tristimulus values—RY is 88.5. Color coordinates Gx and Gy of the green light-emitting device GP are 0.184 and 0.716, respectively, and one of the tristimulus values—GY is 59.8. Color coordinates Bx and By of the blue light-emitting device BP are 0.143 and 0.057, respectively, and one of the tristimulus values—BY is 19.0. It can be seen from this that the display panel in some embodiments of the present disclosure achieves a requirement of high color gamut while meeting high PPI.

Figure 8A:
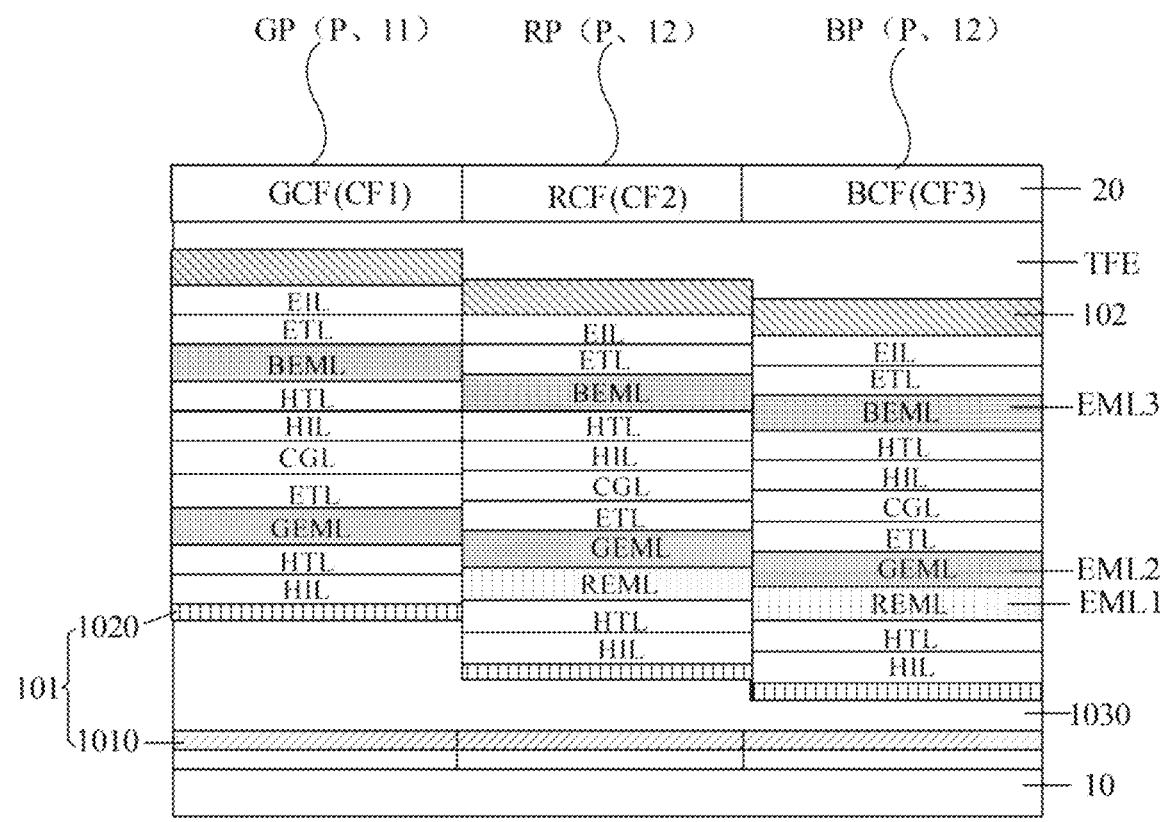
FIG. 8A is a structural diagram of yet another display panel, according to some embodiments of the present disclosure.
Figure 8B:
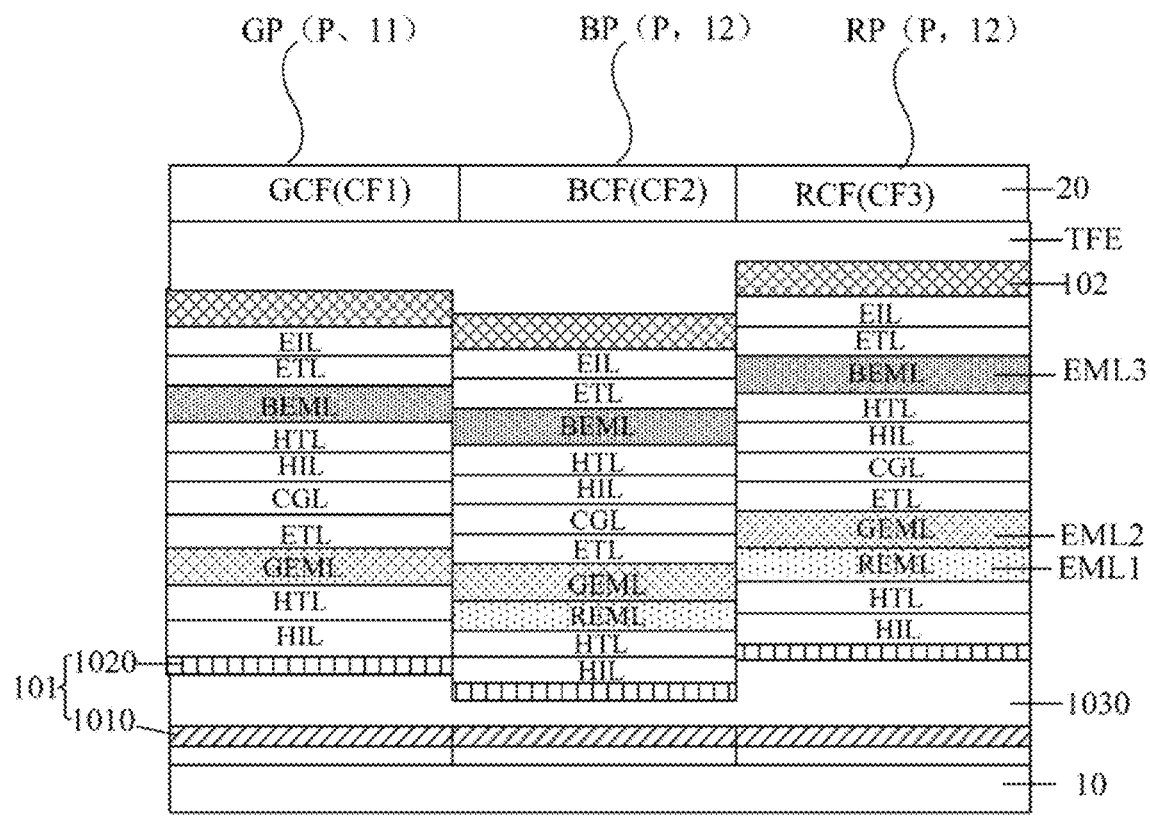
FIG. 8B is a structural diagram of yet another display panel, according to some embodiments of the present disclosure.

In some embodiments, the color of light emitted from the first emission layer EML1 is red, the color of light emitted from the second emission layer EML2 is green, and the color of light emitted from the third emission layer EML3 is blue. As shown in FIG. 8A, the first color filter portion CF1 allows green light to pass through, the second color filter portion CF2 allows red light to pass through, and the third color filter portion CF3 allows blue light to pass through. Or, as shown in FIG. 8B, the first color filter portion CF1 allows green light to pass through, the second color filter portion CF2 allows blue light to pass through, and the third color filter portion CF3 allows red light to pass through.

Figure 9A:
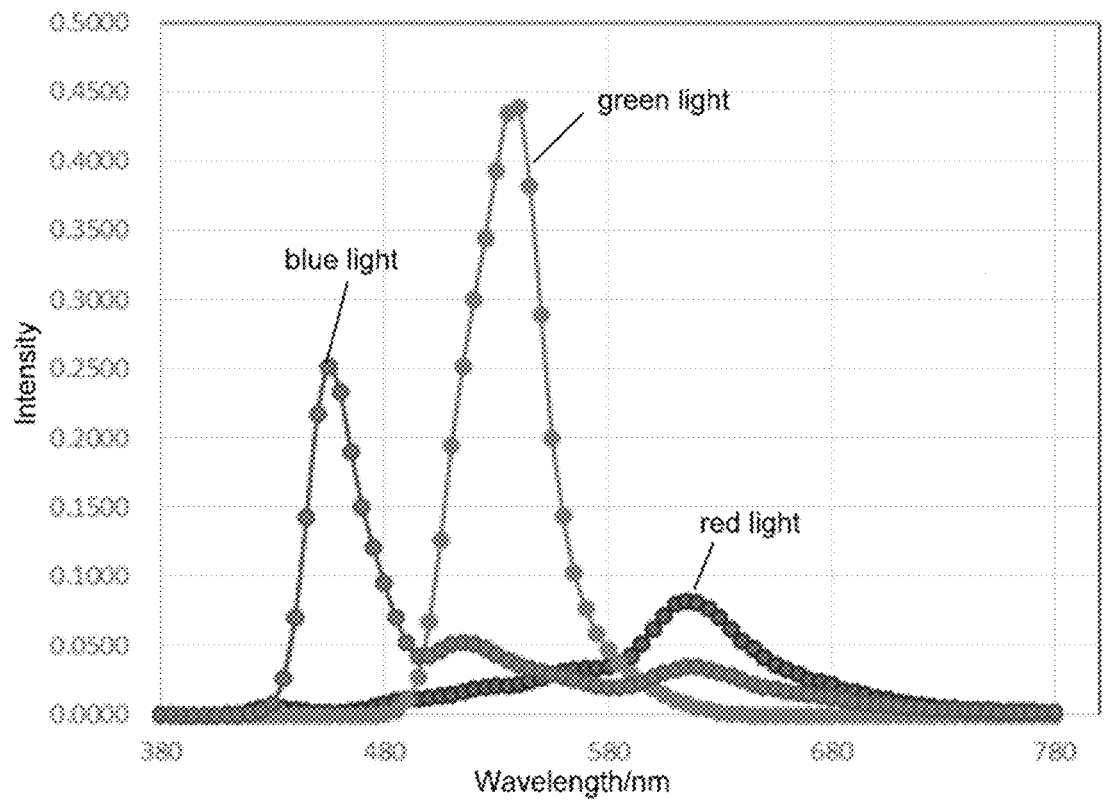
FIG. 9A is a comparison diagram of brightness of simulated light emitted from light-emitting devices of different colors in the display panel shown in FIG. 8A or 8B.

The first emission portion (a red emission portion) is not disposed in the first light-emitting device (a green light-emitting device GP), and different emission portions do not share the carrier transport layer(s), and thus the electrical influence (for example, the limitation of the numbers of holes and electrons) caused by different emission portions sharing the carrier transport layer(s) may be avoided. As shown in FIG. 9A, an intensity of light emitted from the green light-emitting device GP (i.e., light emission efficiency of green light) is significantly higher than intensities of light emitted from other light-emitting devices. Therefore, it can be seen that the above arrangement improves the light emission efficiency of the first light-emitting device (the green light-emitting device GP).

Figure 9B:
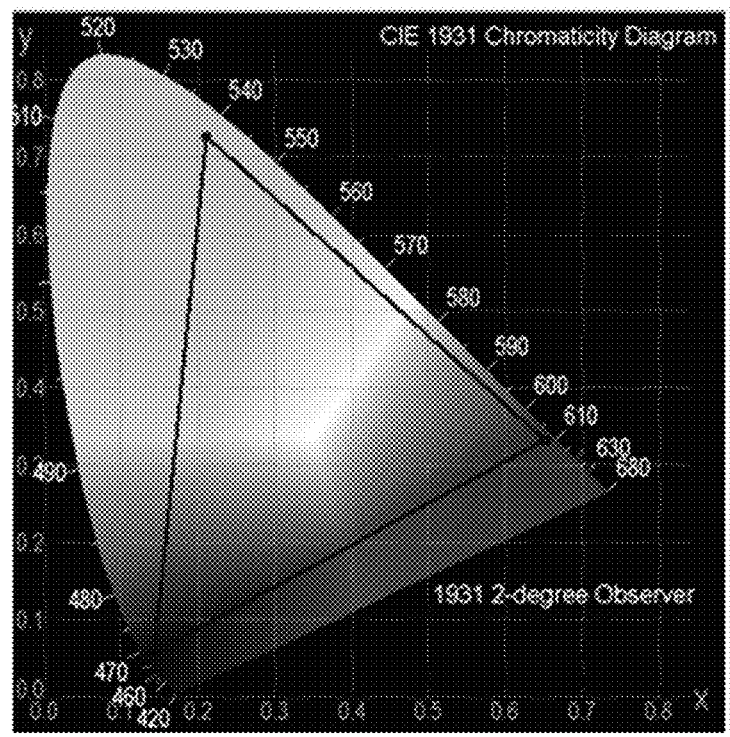
FIG. 9B is a diagram showing color gamut of the display panel shown in FIG. 8A or 8B.

In addition, after performing the color gamut simulation on the above display panel, according to the simulation results, as shown in FIG. 9B, NTSC is 108%. Color coordinates Rx and Ry of the red light-emitting device RP are 0.661 and 0.337, respectively, and one of the tristimulus values—RY is 44.8. Color coordinates Gx and Gy of the green light-emitting device GP are 0.211 and 0.739, respectively, and one of the tristimulus values—GY is 72.8. Color coordinates Bx and By in the blue light-emitting device BP are 0.143 and 0.057, and one of the tristimulus values—BY is 19.0. It can be seen from this that the display panel in some embodiments of the present disclosure achieves the requirement of high color gamut while meeting high PPI.

Some embodiments of the present disclosure do not limit a value of N. For example, N is equal to 4 or N is equal to 5.

In some examples, N is equal to 4. The plurality of emission layers include four emission layers, for example, a red emission layer, a green emission layer, a blue emission layer and a yellow emission layer. In this case, the plurality of color filter portions have 4 or less colors. That is, the plurality of color filter portions allow light of 4 or fewer colors to pass through.

In some other examples, N is equal to 5. The plurality of emission layers include five emission layers, for example, a red emission layer, a green emission layer, a blue emission layer, a yellow emission layer and a cyan emission layer. In this case, the plurality of color filter portions have 5 or less colors. That is, the plurality of color filter portions allow light of 5 or fewer colors to pass through.

In the examples where N is equal to 4 and N is equal to 5, one of the red light-emitting device RP and the green light-emitting device GP may be disposed as the first light-emitting device 11, or both the red light-emitting device RP and the green light-emitting device GP may be disposed as the first light-emitting devices 11, which is not limited in the present disclosure.

In some embodiments, the color filter layer may be disposed on the driving substrate, or may be separately disposed in a color filter substrate that is paired with the driving substrate, which is specifically not limited in some embodiments of the present disclosure.

Figure 10:
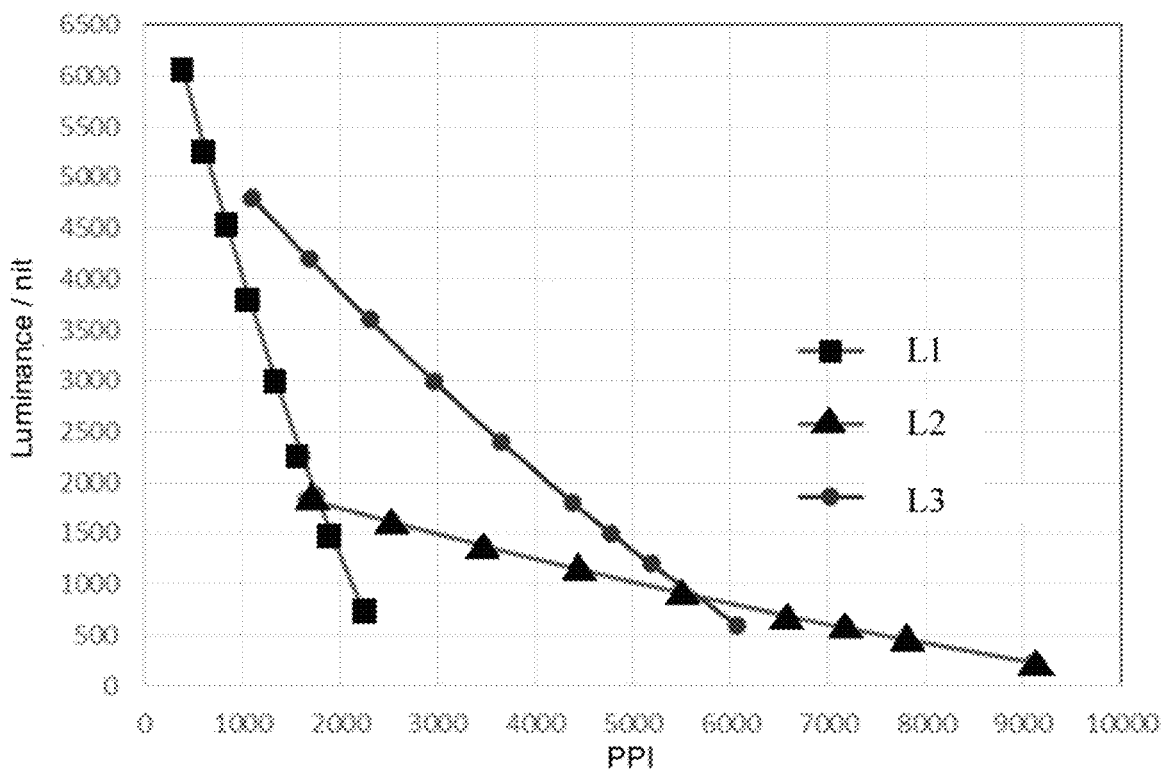
FIG. 10 is a comparison diagram of performance of a display panel according to some embodiments of the present disclosure and performance of display panels in the related art.

In some embodiments, as shown in FIG. 10, L1 and L2 are performance curves of two display panels in the related art, and L3 is a performance curve of the display panel in some embodiments of the present disclosure.

As shown in FIG. 10, unlike the FMM used for the display panel in some embodiments of the present disclosure, in a process of manufacturing emission portions in different light-emitting devices in the display panel corresponding to L1, a FMM with one opening corresponding to one sub-pixel region is used. Due to a limitation of the FMM with one opening corresponding to one sub-pixel region, the display panel corresponding to L1 cannot achieve high PPI.

As shown in FIG. 10, with respect to the display panel corresponding to L2, each emission layer is manufactured by using the open mask (i.e., a mask having a large opening corresponding to all sub-pixel regions). Although the display panel may satisfy high PPI (above 1500 PPI), its brightness is low.

In summary, as shown in FIG. 10, it can be seen that the display panel in some embodiments of the present disclosure may meet the display requirements of high brightness and high PPI simultaneously, thereby meeting market demands, and may be applied to the field of micro display.

In summary, the display panels in some embodiments of the present disclosure may meet display requirements of high brightness and high PPI simultaneously. Specifically, in some embodiments, the color gamut NTSC of the display panel may reach 108%, and the light emission efficiency may be greater than 34 cd/A.

Figure 11:
FIG. 11 is a structural diagram of a display apparatus, according to some embodiments of the present disclosure.

Some embodiments of the present disclosure provide a display apparatus. As shown in FIG. 11, the display apparatus 300 includes the display panel 200 according to any one of the embodiments described above. The display apparatus has the same beneficial effects as the display substrate 100 or the display panel 200 according to any one of the embodiments described above, which will not be described in detail herein again.

For example, the display apparatus 300 is an OLED display apparatus (for example, an active-matrix organic light-emitting diode (AMOLED) display apparatus), a Micro-LED display apparatus, a Mini-LED display apparatus, etc.

For example, the display apparatus 300 may be any apparatus that displays moving images (for example, a video), fixed images (for example, a static image), literal images or graphical images. More specifically, it is anticipated that the described embodiments may be implemented in or associated with a plurality of electronic devices. The plurality of the electronic devices may include but not limit to: mobile phones, wireless devices, personal digital assistant, hand-held or portable computers, global positioning system (GPS) receivers/navigators, cameras, MP4 video players, video cameras, game consoles, watches, clocks, calculators, TV monitors, flat panel displays, computer monitors, car displays (such as an odometer display), navigators, camera view displays (such as a rear view camera display in a vehicle), electronic photos, electronic billboards or direction boards, projectors, building structures, packaging and aesthetic structures (such as a display for an image of a piece of jewelry).

In addition, since the display substrate, the display panel and the display apparatus in some embodiments of the present disclosure have high brightness, high PPI and wide color gamut, they may be well applied to the field of micro display, for example, an augmented reality (AR) display field, a virtual reality (VR) display field, or a display field related to portable electronic devices (such as a smart watch).

The foregoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display substrate, comprising:
a driving substrate; and
a stacked structure disposed at a side of the driving substrate, and the stacked structure including a plurality of emission layers and a plurality of carrier transport layers that are stacked in a direction perpendicular to the side of the driving substrate,
wherein the stacked structure forms a plurality of light-emitting devices, and each light-emitting device of the plurality of light-emitting devices includes at least two emission portions that are respectively in at least two of the plurality of emission layers,
wherein the plurality of light-emitting devices include:
a plurality of first light-emitting devices and a plurality of second light-emitting devices;
emission portions in each first light-emitting device of the plurality of first light-emitting devices are spaced from each other; and
two emission portions in each second light-emitting device of the plurality of second light-emitting devices are in direct contact with each other, and the two emission portions share at least one of the plurality of carrier transport layers,
wherein each of the plurality of light-emitting devices further includes:
a first electrode disposed at a side of the at least two emission portions in a light-emitting device proximate to the driving substrate; and
a second electrode disposed at a side of the at least two emission portions in the light-emitting device away from the driving substrate,
wherein the first electrode includes a reflective electrode, and the second electrode is a translucent electrode, and
wherein the first electrode further includes:
a transparent electrode disposed at a side of the reflective electrode proximate to the at least two emission portions in the light-emitting device, the transparent electrode being electrically connected to the reflective electrode; and
a microcavity adjustment layer disposed between the transparent electrode and the reflective electrode, thicknesses of microcavity adjustment layers in the plurality of light-emitting devices being not completely the same, and
wherein each emission layer of the plurality of emission layers is capable of emitting light of one color, and different emission layers in the light emitting device emit light of different colors.

2. The display substrate according to claim 1, wherein at least one emission portion in a first light-emitting device is in a same emission layer as any one of the two emission portions in a second light-emitting device, and
wherein a number of the emission portions included in the first light-emitting device is less than a number of the emission portions included in the second light-emitting device.

3. The display substrate according to claim 1, wherein the first light-emitting device includes at least two emission portions, and
wherein the second light-emitting device includes at least three emission portions.

4. The display substrate according to claim 1, wherein the display substrate has a plurality of pixel regions, and each pixel region of the plurality of pixel regions includes at least one first sub-pixel region and at least two second sub-pixel regions, and
wherein, in each pixel region, at least one first light-emitting device is disposed in the at least one first sub-pixel region respectively, and at least two second light-emitting devices are disposed in the at least two second sub-pixel regions respectively; and the at least two second light-emitting devices respectively disposed in the at least two second sub-pixel regions are arranged adjacent to each other.

5. The display substrate according to claim 4, wherein in each pixel region and in the at least two second light-emitting devices respectively disposed in the at least two second sub-pixel regions of the pixel region, emission portions that emit light having a same color have an integrated structure.

6. The display substrate according to claim 1, wherein the plurality of emission layers include a first emission layer, a second emission layer and a third emission layer, and colors of light emitted from the first, second, and third emission layers are different,
wherein a first light-emitting device includes a second emission portion in the second emission layer and a third emission portion in the third emission layer,
wherein a second light-emitting device includes a first emission portion in the first emission layer, a second emission portion in the second emission layer, and a third emission portion in the third emission layer, and
wherein the first emission portion and the second emission portion in the second light-emitting device are in direct contact with each other, and the first emission portion and the second emission portion in the second light-emitting device share the at least one of the plurality of carrier transport layers.

7. The display substrate according to claim 6, wherein a color of light emitted from the first emission layer is green, and a color of light emitted from the second emission layer is red; or, a color of light emitted from the first emission layer is red, and a color of light emitted from the second emission layer is green; and
wherein a color of light emitted from the third emission layer is blue.

8. The display substrate according to claim 1, wherein a pixel density of the display substrate is greater than or equal to 1600 PPI.

9. The display substrate according to claim 1, wherein the driving substrate includes a base substrate, and the base substrate is a silicon chip.

10. A display panel, comprising:
the display substrate according to claim 1; and
a color filter layer disposed at a side of the stacked structure of the display substrate away from the driving substrate,
wherein the color filter layer includes a plurality of color filter portions, and the plurality of color filter portions corresponds to the plurality of light-emitting devices respectively, and
wherein each color filter portion of the plurality of color filter portions is configured to filter light emitted from a light-emitting device corresponding to the color filter portion to allow predetermined light of a single color to pass through.

11. The display panel according to claim 10, wherein a color of light allowed to pass through the color filter portion is at least the same as a color of light emitted from one emission portion in the light-emitting device corresponding to the color filter portion.

12. The display panel according to claim 11, wherein the plurality of color filter portions include N types of color filter portions, and the N types of color filter portions allow light of N colors to pass through respectively,
wherein the plurality of emission layers include N emission layers, and the N emission layers are capable of emitting light of N colors, and N colors of light that is emitted from the N emission layers are the same as N colors of light that is allowed to pass through the N types of color filter portions, and
wherein N is a positive integer greater than or equal to 3.

13. The display panel according to claim 12, wherein N is equal to 3, the plurality of color filter portions include a plurality of first color filter portions, a plurality of second color filter portions and a plurality of third color filter portions, and the plurality of emission layers include a first emission layer, a second emission layer, and a third emission layer,
wherein the first light-emitting device includes a second emission portion in the second emission layer and a third emission portion in the third emission layer, and the second light-emitting device includes a first emission portion in the first emission layer, a second emission portion in the second emission layer, and a third emission portion in the third emission layer;
wherein the first emission portion and the second emission portion in the second light-emitting device are adjacent to each other, and the first emission portion and the second emission portion in the second light-emitting device share the at least one of the plurality of carrier transport layers,
wherein the display substrate has a plurality of pixel regions, and each of the plurality of pixel regions includes one first sub-pixel region and two second sub-pixel regions; the first light-emitting device is located in the first sub-pixel region, and the second light-emitting device is located in the second sub-pixel region, and
wherein, in each pixel region, one first color filter portion is located in the first sub-pixel region, one second color filter portion is located in one of the two second sub-pixel regions, and one third color filter portion is located in the other of the two second sub-pixel regions.

14. The display panel according to claim 13, wherein a color of light emitted from the first emission layer is green, a color of light emitted from the second emission layer is red, and a color of light emitted from the third emission layer is blue; and the first color filter portion allows red light to pass through, the second color filter portion allows green light to pass through, and the third color filter portion allows blue light to pass through; or, the first color filter portion allows red light to pass through, the second color filter portion allows blue light to pass through, and the third color filter portion allows green light to pass through, or
wherein a color of light emitted from the first emission layer is red, a color of light emitted from the second emission layer is green, and a color of light emitted from the third emission layer is blue; and the first color filter portion allows green light to pass through, the second color filter portion allows red light to pass through, and the third color filter portion allows blue light to pass through; or, the first color filter portion allows green light to pass through, the second color filter portion allows blue light to pass through, and the third color filter portion allows red light to pass through.

15. The display panel according to claim 10, wherein in the emission portions of the light-emitting device, a phase change of light, which travels in a round trip light path between an emission portion of the light-emitting device that emits light having a same color as a color of the color filter portion corresponding to the light-emitting device and the reflective electrode in the first electrode of the light-emitting device, is an integer multiple of $2\pi$.

16. A display apparatus, comprising the display panel according to claim 10.

* * * * *